United States Patent
Serene et al.

(10) Patent No.: US 9,681,244 B1
(45) Date of Patent: Jun. 13, 2017

(54) METHOD FOR MANUFACTURING MICROPHONE CHIP

(71) Applicants: Goh Wan Ling Serene, Singapore (SG); Loo Li Eng, Singapore (SG); Tan Qiu Yu Veronica, Singapore (SG); Xiaohui Zhong, Singapore (SG); Lin Yih Shung, Singapore (SG); Lai Kah Keen, Singapore (SG)

(72) Inventors: Goh Wan Ling Serene, Singapore (SG); Loo Li Eng, Singapore (SG); Tan Qiu Yu Veronica, Singapore (SG); Xiaohui Zhong, Singapore (SG); Lin Yih Shung, Singapore (SG); Lai Kah Keen, Singapore (SG)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 0 days.

(21) Appl. No.: 15/297,516

(22) Filed: Oct. 19, 2016

(30) Foreign Application Priority Data

Dec. 3, 2015 (CN) .......................... 2015 1 0875602

(51) Int. Cl.
| | | |
|---|---|---|
| *H01L 21/00* | (2006.01) | |
| *H04R 31/00* | (2006.01) | |
| *H04R 19/00* | (2006.01) | |
| *H04R 19/04* | (2006.01) | |
| *H04R 7/16* | (2006.01) | |

(52) U.S. Cl.
CPC ............. *H04R 31/003* (2013.01); *H04R 7/16* (2013.01); *H04R 19/005* (2013.01); *H04R 19/04* (2013.01); *H04R 2201/003* (2013.01); *H04R 2207/021* (2013.01)

(58) Field of Classification Search
None
See application file for complete search history.

(56) References Cited

U.S. PATENT DOCUMENTS

| | | | |
|---|---|---|---|
| 2005/0005421 A1* | 1/2005 | Wang ................... | H04R 19/005 29/594 |
| 2014/0145276 A1* | 5/2014 | Rombach ............. | H04R 19/005 257/416 |
| 2015/0061048 A1* | 3/2015 | Escher-Poeppel ..... | H04R 1/021 257/416 |
| 2016/0221822 A1* | 8/2016 | Krumbein .............. | H04R 23/00 |

* cited by examiner

*Primary Examiner* — Angel Roman
(74) *Attorney, Agent, or Firm* — Na Xu; IPro, PLLC

(57) ABSTRACT

A method for manufacturing a microphone chip, includes steps of: providing a first underlay, and depositing insulating oxide layers at both sides; depositing the component layers on the insulating oxide layers respectively; depositing the tetraethyl orthosilicate oxide layers on the component layers; etching the tetraethyl orthosilicate oxide layers; patterning various deposition layers in the first underlay; providing the second underlay; depositing the oxide layers on the substrate; etching and patterning oxide layer; releasing the back plate; combining the first underlay and the second underlay by welding the tetraethyl orthosilicate oxide layer on the first underlay and the oxide layer on the second underlay under ambient temperature; etching the second underlay to form the back cavity; etching the first underlay to release the diaphragm and obtaining the microphone chip.

10 Claims, 4 Drawing Sheets

METHOD FOR MANUFACTURING MICROPHONE CHIP

FIELD OF THE INVENTION

The present invention relates to a method for manufacturing a microphone, and more particularly to a method for manufacturing a chip of a MEMS microphone.

DESCRIPTION OF RELATED ART

So far, in all the methods of manufacturing the microphone based on the semi-conductor material, polycrystalline silicon is deposited on the substrate to form the diaphragm and back plate, due to the deposit of multi-layer structure, the processes including the high temperature bonding etc. make it hard to control the stress of the diaphragm and back plate, it is very hard to improve its sensitivity and consistency.

Therefore, it is necessary to provide an improved method for a microphone chip to overcome above disadvantage.

BRIEF DESCRIPTION OF THE DRAWINGS

Many aspects of the embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EXEMPLARY EMBODIMENT

The present invention will hereinafter be described in detail with reference to an exemplary embodiment. To make the technical problems to be solved, technical solutions and beneficial effects of present disclosure more apparent, the present disclosure is described in further detail together with the figures and the embodiment. It should be understood the specific embodiment described hereby is only to explain this disclosure, not intended to limit this disclosure.

Figure 10:
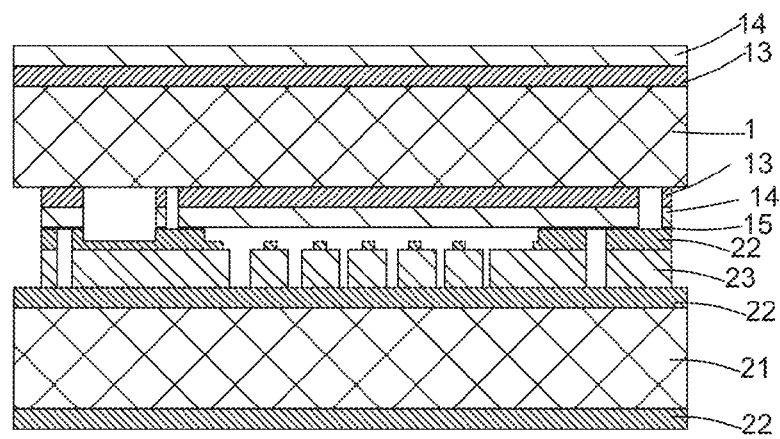
FIG. 10 is an illustration indicating a Step X of the method for manufacturing the microphone chip.

Referring to FIG. 10, a microphone chip related to an exemplary embodiment of the present disclosure includes a diaphragm 300, a back plate 700 with a certain distance away from the diaphragm 300, a bonding layer 400 clamped between the diaphragm 300 and the back plate 700, and an anti-stick protrusion 500 formed on the back plate 700.

Figure 1:
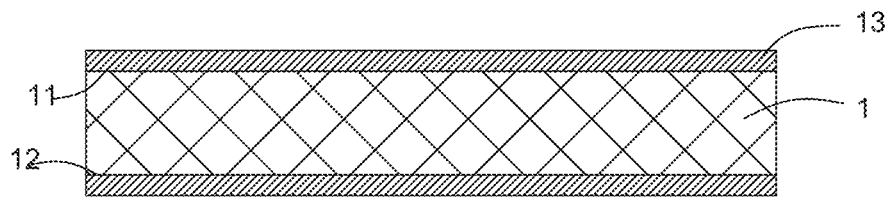
FIG. 1 is an illustration indicating a Step I of a method for manufacturing a microphone chip in accordance with an exemplary embodiment of the present disclosure.
Figure 2:
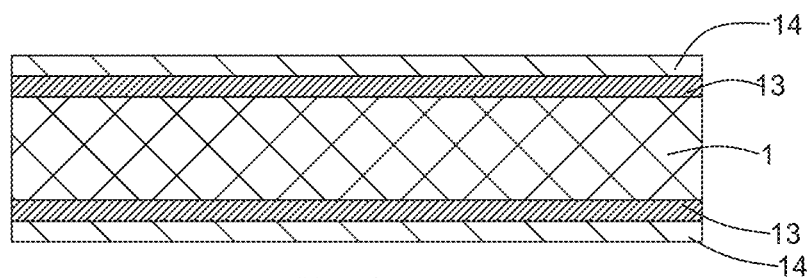
FIG. 2 is an illustration indicating a Step II of the method for manufacturing the microphone chip.

A method for manufacturing the microphone chip includes the following steps:

Step I (S1): as shown in FIG. 1, providing a first underlay 1 including a first surface 11 and an opposite second surface 12, and an insulating oxide layers 13 deposited on the first surface 11 and the second surface 12, wherein, the insulating oxide layer 13 may comprises silicon oxide;

Step II (S2): as shown in FIG. 2, a plurality of component layers 14 is deposited on the insulating oxide layers 13 of the first surface 11 and the second surface 12, and the component layer 14 is used for molding the component structure, e.g. the diaphragm 300. In this embodiment, the component 14 can be polycrystalline silicon etc.

Figure 3:
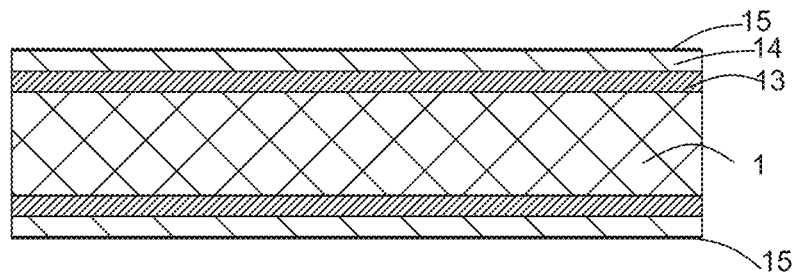
FIG. 3 is an illustration indicating a Step III of the method for manufacturing the microphone chip.

Step III (S3): As shown in FIG. 3, a tetraethyl orthosilicate oxide layer 15 is deposited on the component layers 14 of the first surface 11 and the second surface 12. Then, passivation finish is completed for the first surface 11 of the first underlay 1 with multi-layer structure. Therefore, the tetraethyl orthosilicate oxide layers 15 are deposited at both sides of the first underlay 1 is to protect the component layer 14 in the process of subsequent passivation finish. In this embodiment, the tetraethyl orthosilicate oxide layer 15 can be welded with other oxide layer under ambient temperature.

Figure 4:
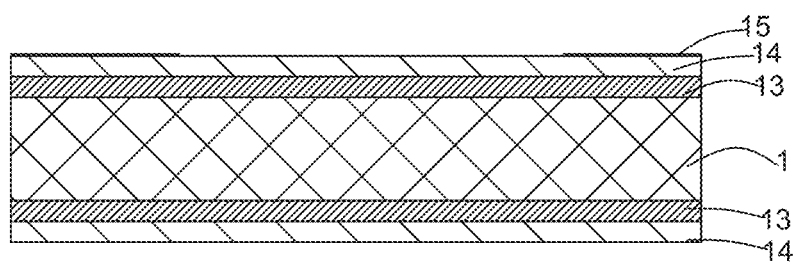
FIG. 4 is an illustration indicating a Step IV of the method for manufacturing the microphone chip.

Step IV (S4): as shown in FIG. 4, etching the tetraethyl orthosilicate oxide layer 15 on the first surface 11 and exposing the component layer 14, while removing the tetraethyl orthosilicate oxide layer 15 by the side of the second surface 12.

Figure 5:
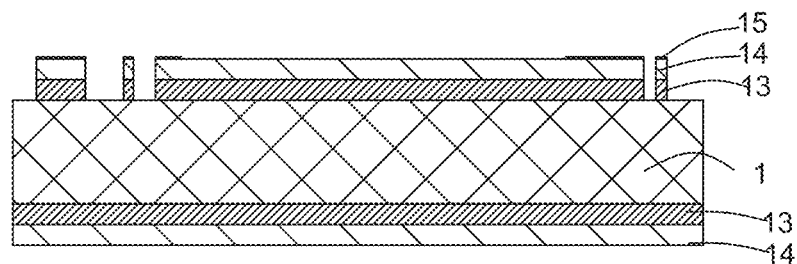
FIG. 5 is an illustration indicating a Step V of the method for manufacturing the microphone chip.

Step V (S5): as shown in FIG. 5, patterning the insulating oxide layer 13, component layer 14 and tetraethyl orthosilicate oxide layer 15 deposited on the first surface 11 of the first underlay 1 in turn, and keeping part of tetraethyl orthosilicate oxide layer 15 as the bonding layer.

Figure 6:
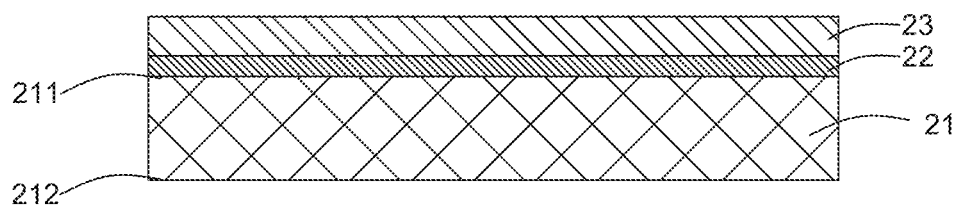
FIG. 6 is an illustration indicating a Step VI of the method for manufacturing the microphone chip.

Step VI (S6): as shown in FIG. 6, providing a second underlay 2, and the second underlay 2 is SOI underlay, including a substrates 21 with a third surface 211 and a fourth surface 212 opposite to the third surface 211, an oxide layer 22 deposited on the third surface 211 of the substrate 21, and a monocrystalline silicon layer 23 deposited on the oxide layer 22.

Figure 7:
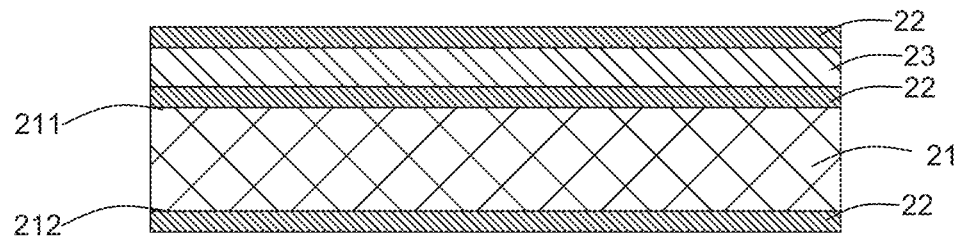
FIG. 7 is an illustration indicating a Step VII of the method for manufacturing the microphone chip.

Step VII (S7): as shown in FIG. 7, depositing the oxide layers 22 on the fourth surface 212 of the substrate 21 and the surface of the monocrystalline silicon layer 23.

Figure 8:
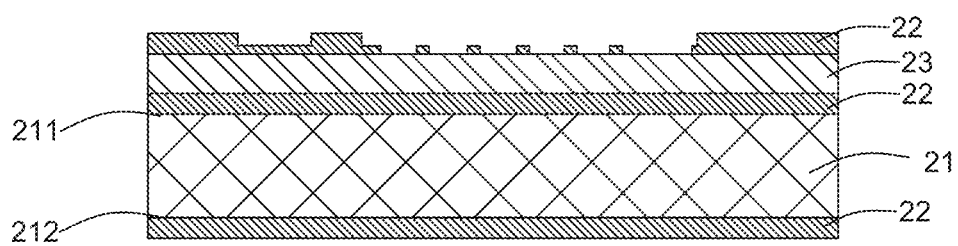
FIG. 8 is an illustration indicating a Step VIII of the method for manufacturing the microphone chip.

Step VIII (S8): as shown in FIG. 8, etching the oxide layer 22 on the surface of the monocrystalline silicon layer 23; continuing to pattern the etched oxide layer 22 with the photoetching technology, and making it form anti-stick protrusion 500 with many intervals on the surface of the monocrystalline silicon layer 23, and these bulges are used for preventing the bonding between the back plate and the diaphragm in the subsequent procedures.

Figure 9:
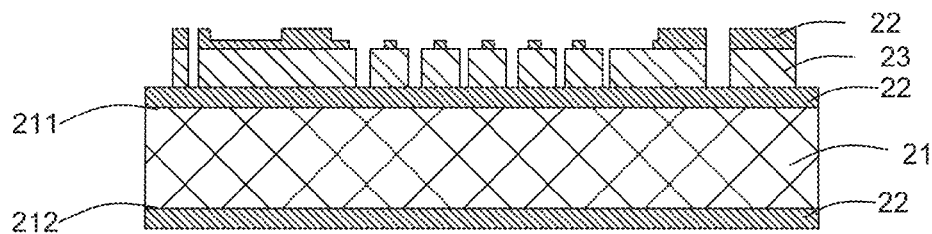
FIG. 9 is an illustration indicating a Step IX of the method for manufacturing the microphone chip.

Step IX (S9): as shown in FIG. 9, etching for generating acoustic holes 231 in the monocrystalline silicon layer 23 in order to release the back plate 700.

Step X (S10): as shown in FIG. 10, conducting passivation finish to the first surface 11 of the first underlay 1 and the third surface 211 of the second underlay 2, and then cleaning the first surface 11 and the third surface 211 with the acid solution including the sulphuric acid and hydrofluoric acid etc.; aligning the first surface 11 of the first underlay 1 and the third surface 211 of the second underlay 2, and making the tetraethyl orthosilicate oxide layer 15 on the first surface 11 of the first underlay 1 contact with the oxide layer 22 of the third surface 211 of the second underlay 2 mutually, and combining the tetraethyl orthosilicate oxide layer 15 and the oxide layer 22 to form the bonding layer 400 by welding under the ambient temperature. The scope of ambient temperature is 22±3° C. Annealing the first underlay 1 and the second underlay 2 that are combined together under low temperature, and the annealing temperature is kept between 700° C.~900° C. This method can strengthen the bonding of both, while not generating much stress from the layer structures at both sides. Then, grinding the first underlay 1, and removing the component layer 14 and insulating oxide layer 13 from the second surface 12 of the first underlay 1.

Figure 11:
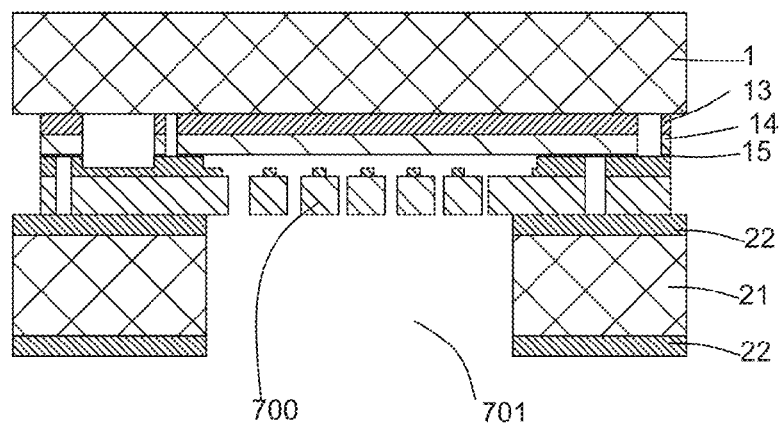
FIG. 11 is an illustration indicating a Step XI of the method for manufacturing the microphone chip.
Figure 12:
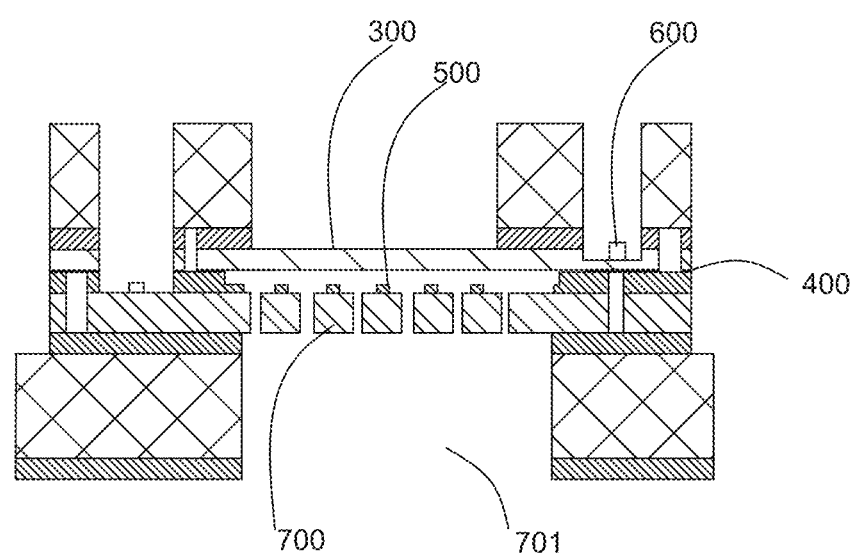
FIG. 12 is an illustration indicating a Step XII of the method for manufacturing the microphone chip.

Step XI (S11): as shown in FIG. 11, etching the oxide layer 22 and substrate 21 of the fourth surface 212 of the second underlay 2 for forming the back cavity 701 corresponding to the back plate 700;

Step XII (S12): as shown in FIG. 12, further etching the first underlay 1 to release the diaphragm 300 and then obtain the microphone chip. In this embodiment, it also includes: depositing the conduction layers on the first underlay 1 and the second underlay 2 then etching this conduction layers to form the conduction solder pad 600.

In this embodiment, it combines the tetraethyl orthosilicate oxide layer and the oxide layer with the oxide layer of the second underlay by welding under ambient temperature, in order to maintain the inherent stress from the component layer of the microphone chip in the similar stress area, meanwhile, it can also reduce the impact to the component layer from the externally thermal stress. In addition, the composite diaphragm structure has many preheating intervals that can be used for adjusting the stress of the component layer by aiming at different product; the manufacturing method doesn't need additional plasma processing procedure, in order to reduce the processing steps.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A method for manufacturing a microphone chip, comprising the steps of:
   Step I: Providing a first underlay including a first surface and a second surface opposite to the first surface, and then depositing insulating oxide layers on the first surface and second surface respectively;
   S2: Depositing a component layer on the insulating oxide layers of the first surface and second surface respectively;
   S3: Depositing a tetraethyl orthosilicate oxide layer on the surfaces of the component layers on the first surface and the second surface respectively;
   S4: Etching the tetraethyl orthosilicate oxide layer on the first surface of the first underlay for exposing the component layer, while removing the entire tetraethyl orthosilicate oxide layer on the second surface;
   S5: Patterning the insulating oxide layer, component layer and tetraethyl orthosilicate oxide layer on the first surface with the photoetching technology;
   S6: Providing a second underlay including a substrate with a third surface and the fourth surface corresponding opposite to the third surface, and a oxide layer and monocrystalline silicon layer deposited on the third surface;
   S7: Depositing oxide layers on the monocrystalline silicon layers of the described fourth surface and third surface respectively;
   S8: Etching the oxide layer on the monocrystalline silicon layer and then patterning this oxide layer with the photoetching technology for forming a plurality of anti-stick protrusions;
   S9: Etching acoustic holes in the monocrystalline silicon layer for releasing the back plate;
   S10: Combining the first underlay and the second underlay by contacting the tetraethyl orthosilicate oxide layer on the first surface of the first underlay to the oxide layer on the surface of the monocrystalline silicon layer of the second underlay; combining the tetraethyl orthosilicate oxide layer and the oxide layer on the surface of the monocrystalline silicon layer by welding under ambient temperature;
   S11: Etching the oxide layers on the substrate of the second underlay and the fourth surface for forming a back cavity;
   S12: Etching to the component layer from the second surface of the first underlay, for releasing the diaphragm and obtain the microphone chip.

2. The method of manufacturing a microphone chip as described in claim 1, wherein, between the procedure S3 and S4, it also involves passivation finish to the first surface of the first underlay.

3. The method of manufacturing a microphone chip as described in claim 2, wherein before the procedure S10, it involves passivation finish to the first surface of the first underlay and the third surface of the second underlay, and then cleaning the described first surface and third surface.

4. The method of manufacturing a microphone chip as described in claim 3, wherein, the first underlay is grinded and the component layer and insulating oxide layer on the second surface of the first underlay should be removed.

5. The method for manufacturing the microphone chip as described in claim 4, wherein, between the procedure S10 and S11, the first underlay and second underlay that are combined together should be annealed under low temperature.

6. The method of manufacturing the microphone chip as described in claim 5, wherein, the described annealing temperature should be between 700° C.~900° C.

7. The method of manufacturing the microphone chip as described in claim 1, wherein, the insulating oxide layer is a silicon oxide layer.

8. The method of manufacturing the microphone chip as described in claim 1, wherein, the component layer is polycrystalline silicon layer.

9. The method of manufacturing the microphone chip as described in claim 1, wherein, after the S12, a step of depositing the conduction layers on the first underlay and the second underlay respectively is further conducted.

10. The method of manufacturing the microphone chip as described in claim 1, wherein, in S10, in the process of welding under the ambient temperature, the scope of the ambient temperature is 22±3° C.

* * * * *